(12) United States Patent
Brigham et al.

(10) Patent No.: US 6,274,913 B1
(45) Date of Patent: Aug. 14, 2001

(54) SHIELDED CHANNEL TRANSISTOR STRUCTURE WITH EMBEDDED SOURCE/DRAIN JUNCTIONS

(75) Inventors: Lawrence N. Brigham, Beaverton; Richard Green, Aloha; Ebrahim Andideh, Portland, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/166,818

(22) Filed: Oct. 5, 1998

(51) Int. Cl.[7] .................................................. H01L 29/76
(52) U.S. Cl. .............................. 257/368; 257/24; 257/57; 257/66; 257/396; 257/520
(58) Field of Search ................................... 257/347–355, 257/24, 57, 66, 396, 520, 368

(56) References Cited

U.S. PATENT DOCUMENTS 5,914,517 * 6/1999 Konogi .................................. 257/350
5,929,490 * 7/1999 Onishi .................................. 257/347

* cited by examiner

Primary Examiner—Fetsum Abraham
(74) Attorney, Agent, or Firm—Raymond J. Werner

(57) ABSTRACT

Microelectronic structures embodying the present invention include a silicon pillar contiguous with a bulk semiconductor, the pillar being surrounded by a shallow trench isolation insulator, which has been recessed to receive polysilicon and a superjacent layer of silicon deposited thereon. Source and drain (S/D) terminals are formed in the silicon of the recessed portions of the shallow trench isolation insulator. In this way the S/D terminals are substantially isolated from the body, thereby substantially reducing both parasitic junction capacitance and junction leakage currents. Isolation of S/D terminals in this way also reduces the degradation of effective channel length that can otherwise occur in MOSFETs.

9 Claims, 8 Drawing Sheets

US 6,274,913 B1

SHIELDED CHANNEL TRANSISTOR STRUCTURE WITH EMBEDDED SOURCE/DRAIN JUNCTIONS

BACKGROUND OF THE INVENTION

1. Field of the Invention

The invention relates to metal-oxide-semiconductor field effect transistors (MOSFETs) and more particularly to transistor structures having very low junction capacitance, and methods of making same.

2. Background

Advances in semiconductor process technology and digital system architecture have led to integrated circuits having increased operating frequencies. Unfortunately, higher operating frequencies result in undesirable increases in power consumption. Power consumption is a significant problem in integrated circuit design generally, and particularly in large scale, high speed products such as processors and microprocessors.

Nonetheless, the trend of integrating more functions on a single substrate while operating at ever higher frequencies goes on unabated.

One way to improve integrated circuit performance, is by reducing the loading capacitance of MOSFETs. Transistor loading capacitance generally has three components, intrinsic gate capacitance, overlap capacitance, and junction capacitance. To reduce junction capacitance, MOSFETs have been constructed on an insulating substrate. This is often referred to as silicon-on-insulator (SOI). Typical SOI processes reduce junction capacitance by isolating junctions from the substrate by interposing a thick buried oxide layer. However, short-channel MOSFETs constructed with thick buried oxide isolation layers tend to have poor punch-through characteristics, poor short-channel characteristics and other effects related to the floating body.

What is needed is a structure having reduced junction capacitance while maintaining good device characteristics. What is further needed is a method of manufacturing such a structure.

SUMMARY OF THE INVENTION

Briefly, a MOSFET structure in which the channel region is contiguous with the semiconductor substrate while the source and drain junctions are substantially isolated from the substrate, includes a dielectric volume formed adjacent and subjacent to portions of the source and drain regions.

In a further aspect of the invention, a process for forming a MOSFET having an isolated source and drain, includes forming a recess in a shallow trench isolation (STI) insulator material that surrounds a pillar of silicon which is contiguous with the substrate, forming a silicon region within the recess, and then completing the operations needed to form a MOSFET, resulting in a MOSFET with a source and drain isolated from the body by STI insulation.

DETAILED DESCRIPTION

Figure 1:
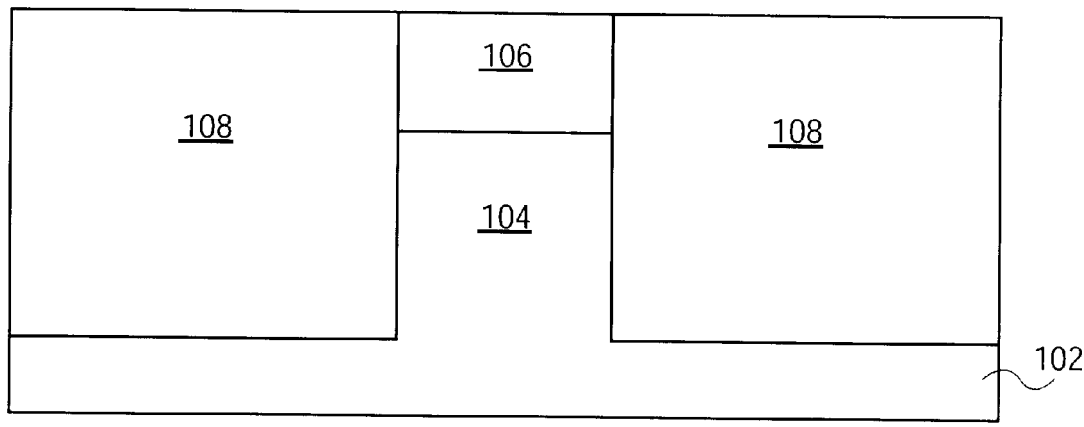
FIG. 1 is a schematic cross-section showing a silicon pillar extending from the substrate, with shallow trench isolation (STI) oxide surrounding the pillar sidewalls, and a masking layer of silicon nitride overlying the pillar.

The speed and power performance characteristics of MOSFET integrated circuits can be improved by reducing parasitic junction capacitance. Various attempts to reduce this junction capacitance have included fabricating transistors on insulating substrates, for example sapphire, or more commonly, a silicon-on-insulator (SOI) substrate. While these approaches do reduce the junction capacitance associated with FET structures by isolating the junctions from the semiconductor body, unfortunately they also create device performance problems due to the floating body effect.

A further performance problem encountered in short channel FETs is that the relatively deep S/D junctions in such a way that at very small channel lengths, the ability to control the effective channel length of the FET is degraded. More generally, it can be said that the relatively deep S/D junctions can exacerbate the observed short channel effects.

FETs embodying the present invention include a silicon pillar, contiguous with the bulk semiconductor, that is substantially surrounded by STI oxide, which has been recessed to receive polysilicon, and a superjacent layer of silicon formed thereon. Subsequent to formation of the recesses in the STI oxide, the uppermost portion of the pillar, which is not covered by the STI oxide, is oxidized to form a barrier layer. The source and drain are formed in the silicon of the recessed portions of the STI oxide. In this way the source and drain are isolated from the body, thereby substantially reducing both parasitic junction capacitance and junction leakage currents. Isolation of the source and drain in this way also reduces the degradation of effective channel length that can otherwise occur.

Terminology

The terms, chip, integrated circuit, monolithic device, semiconductor device, and microelectronic device, are often used interchangeably in this field. The present invention is applicable to all the above as they are generally understood in the field.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally aluminum (Al), copper (Cu) or an alloy of Al and Cu, are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), cobalt (Co), nickel (Ni) and tungsten (W) and refractory metal silicides are examples of other conductors.

The terms contact and via, both refer to structures for electrical connection of conductors from different interconnect levels. These terms are sometimes used in the art to describe both an opening in an insulator in which the structure will be completed, and the completed structure itself. For purposes of this disclosure contact and via refer to the completed structure.

DIBL refers to drain induced barrier lowering.

Epitaxial layer refers to a layer of single crystal semiconductor material.

The term "gate" is context sensitive and can be used in two ways when describing integrated circuits. As used herein, gate refers to the insulated gate terminal of a three terminal FET when used in the context of transistor circuit configuration, and refers to a circuit for realizing an arbitrary logical function when used in the context of a logic gate. A FET can be viewed as a four terminal device when the semiconductor body is considered.

Polycrystalline silicon is a nonporous form of silicon made up of randomly oriented crystallites or domains. Polycrystalline silicon is often formed by chemical vapor deposition from a silicon source gas or other methods and has a structure that contains large-angle grain boundaries, twin boundaries, or both. Polycrystalline silicon is often referred to in this field as polysilicon, or sometimes more simply as poly.

Source/drain terminals refer to the terminals of a FET between which conduction occurs under the influence of an electric field, subsequent to the inversion of the semiconductor surface under the influence of an electric field resulting from a voltage applied to the gate terminal. Generally, the source and drain terminals are fabricated such that they are geometrically symmetrical. With geometrically symmetrical source and drain terminals it is common to simply refer to these terminals as source/drain terminals, and this nomenclature is used herein. Designers often designate a particular source/drain terminal to be a "source" or a "drain" on the basis of the voltage to be applied to that terminal when the FET is operated in a circuit.

SIMOX refers to a process that involves implanting oxygen and high temperature annealing to form a thin silicon film over a buried oxide layer. The acronym "SIMOX" stands for separation by implantation of oxygen. SIMOX is sometimes used in this field to refer to a product that is produced by the SIMOX process.

Substrate, as used herein, refers to the physical object which is the basic workpiece that is transformed by various process operations into the desired microelectronic configuration. A substrate may also be referred to as a wafer. Wafers, may be made of semiconducting, non-semiconducting, or combinations of semiconducting and non-semiconducting materials.

The term vertical, as used herein, means substantially perpendicular to the surface of a substrate.

Method

Referring to FIGS. 1–10, an illustrative embodiment of the method of the present invention is described. As shown in FIG. 1, a wafer is processed in known ways to form patterned and planarized shallow trench isolation regions in a surface of a substrate. Generally, this is accomplished by patterning a material such as silicon nitride on the surface of the wafer, etching and then filling shallow trench isolation regions in the surface of the wafer. The results of this processing can be seen in FIG. 1, where a substrate 102 has one or more pillars 104 which have not been etched because of a hard mask 106, which is typically a patterned silicon nitride layer, and the etched regions are typically filled with an electrically insulating material 108 such as silicon dioxide. The silicon dioxide that fills the trench is sometimes referred to simply as the trench oxide. Alternatively, the shallow trench isolation oxide may be referred to as field oxide. The upper surface of pillar 104 is a portion of the original surface of the wafer.

Figure 2:
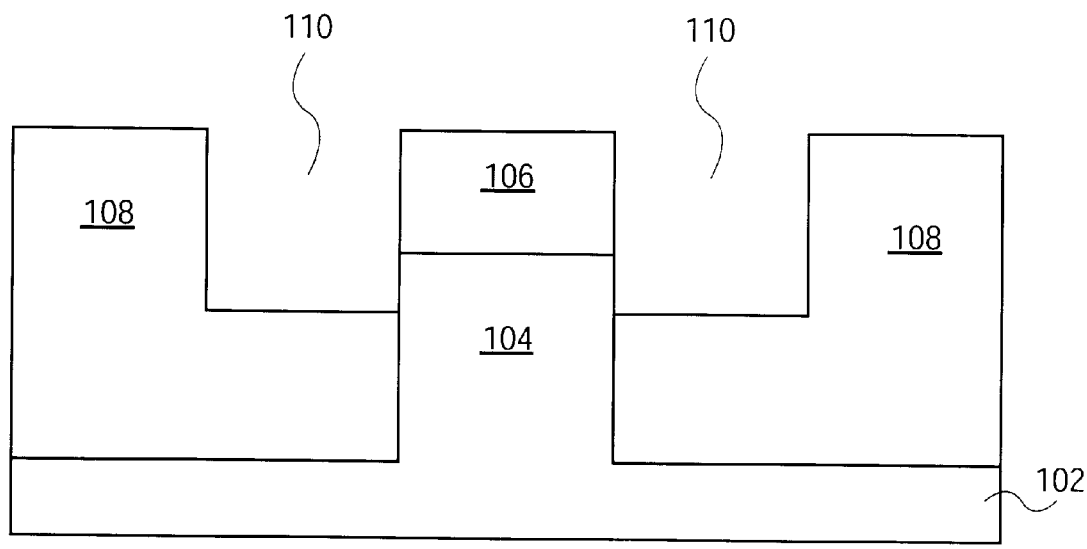
FIG. 2 is a schematic cross-section showing the structure of FIG. 1, after a portion of the STI oxide is removed.

As shown in FIG. 2, the wafer is then subjected to a masking and etching step that removes a portion of trench oxide 108 that is adjacent to pillar 104. A recess 110 formed by this masking and etching operation is typically made on two sides of pillar 104. Two sides are typically used because these will become the source/drain terminals. Recesses 110 are formed to a depth such that a portion the sidewalls of pillar 104 are exposed. Material subsequently formed in recesses 110 will become part of the source/drain terminals.

Figure 3:
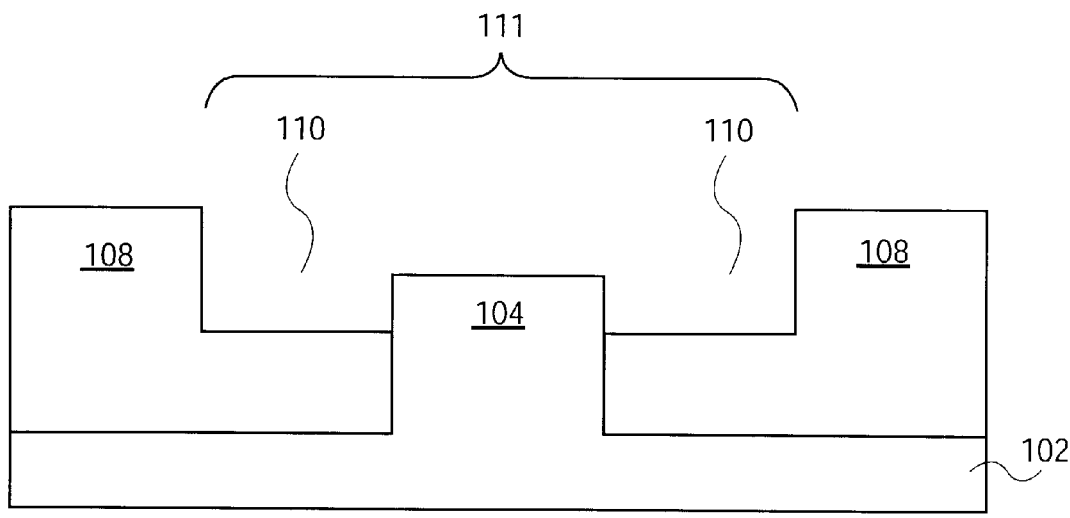
FIG. 3 is a schematic cross-section showing the structure of FIG. 2, after the exposed portion of the pillar sidewall has been oxidized, the masking layer, comprised of silicon nitride, has been removed and a well implant operation has been performed.

Referring to FIG. 3, the structure that results from the removal of hard mask 106, can be seen. As a result of the removal of hard mask 106, recesses 110 are joined to effectively form a super-recess 111.

Figure 4:
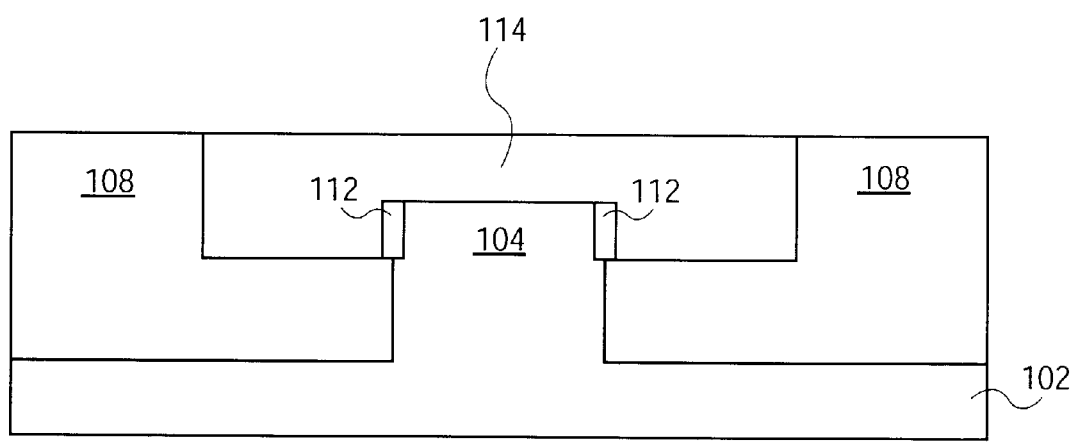
FIG. 4 is a schematic cross-section showing the structure of FIG. 3, after polycrystalline silicon (poly) has been deposited and planarized over the pillar and the recessed portion of the STI oxide.

After removal of hard mask 106, the exposed sidewall portions of pillar 104 are oxidized to form a barrier layer 112 as shown in FIG. 4. In the illustrated embodiment of the present invention, barrier layer 112 has a thickness in the range of approximately 100 angstroms to 300 angstroms. Barrier layer 112 is an electrically insulating material. A polysilicon layer 114 is then formed in super-recess 111. Although the illustrative embodiment uses a polysilicon layer, other materials such as amorphous silicon (a-Si) may be used.

Alternatively, barrier layer 112 may be formed by an oxidation operation prior to removal of hard mask 106. In a further alternative process flow, a polysilicon layer is deposited before the removal of hardmask 106. Those skilled in the art and having the benefit of this disclosure will understand that these and various other trade-offs or design choices are possible with the scope of the present invention.

Figure 5:
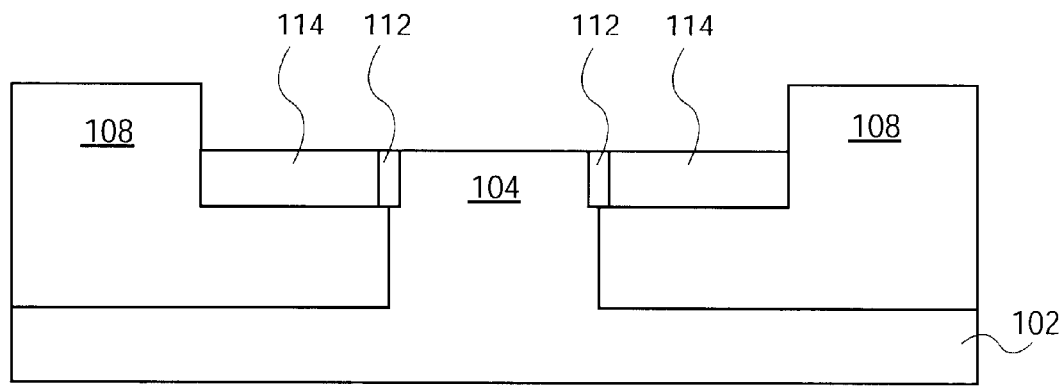
FIG. 5 is a schematic cross-section showing the structure of FIG. 4, after the poly has been etched back.

FIG. 5 shows a schematic cross-sectional view of the structure that results when the structure of FIG. 4 is subjected to a poly etch operation. As a result of etching poly 114, the top surface of poly 114 is lowered until it is substantially even with the top surface of pillar 104. As can be seen in FIG. 5, the top surface of pillar 104 is exposed after this poly etch operation. Additionally, it can be seen that poly 114 is surrounded by electrically insulating material on its bottom and side surfaces.

Figure 6:
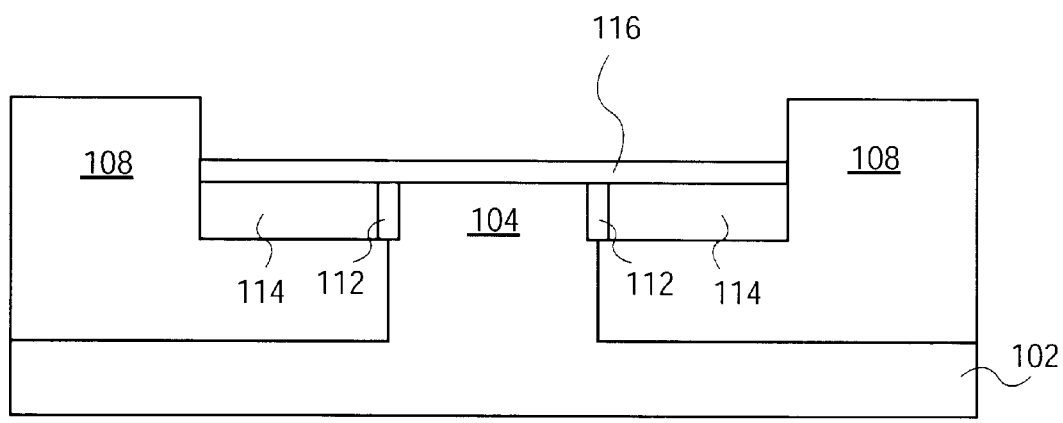
FIG. 6 is a schematic cross-section showing the structure of FIG. 5, after a selective silicon deposition.

FIG. 6 shows a schematic cross-sectional view of the structure that results when the structure of FIG. 5 is subjected to a selective silicon deposition operation. This selective silicon deposition is typically performed in a subatmospheric epi reactor. A silicon layer 116 is formed over pillar 104, barrier layers 112, and poly 114. Silicon layer 116 is a substantially single crystal silicon layer as distinguished from the polycrystalline nature of poly 114. In the illustrated embodiment of the present invention, silicon layer 116 has a thickness in the range of approximately 200 angstroms to 500 angstroms. Due to lateral growth of the silicon, silicon layer 116 will be a continuous film across barrier layers 112. Although the illustrative embodiment uses silicon for layer 116, other materials such as, for example, silicon germanium (SiGe) may also be used.

Figure 7:
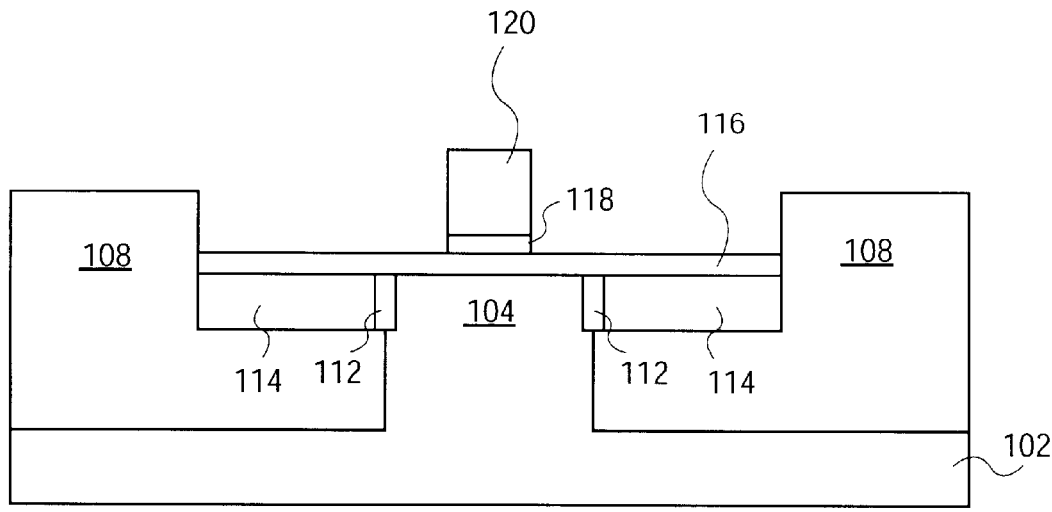
FIG. 7 is a schematic cross-section showing the structure of FIG. 6, after a gate insulator layer is formed and a poly layer has been deposited and gate patterning operation has been performed.
Figure 8:
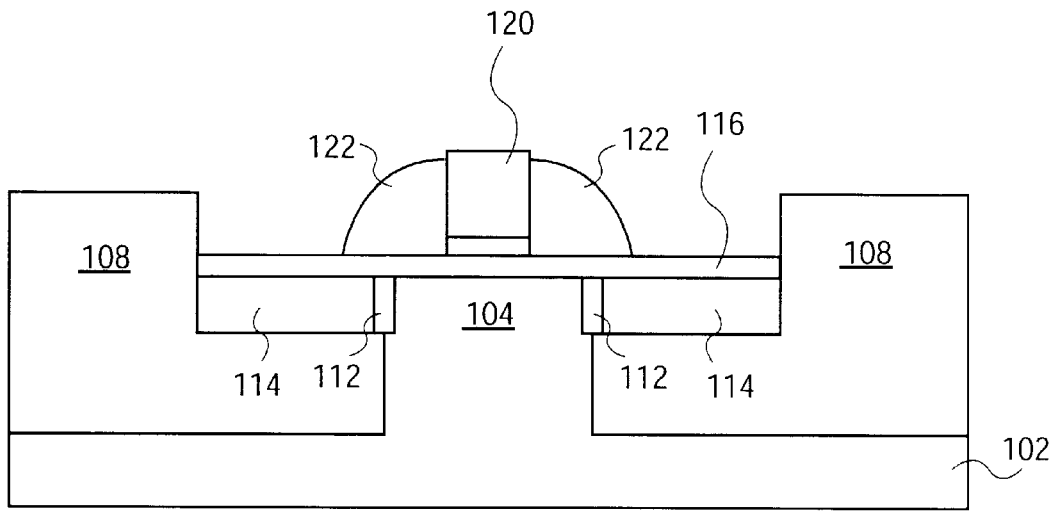
FIG. 8 is a schematic cross-section showing the structure of FIG. 7, after gate sidewall spacers have been formed.

After the formation of silicon layer 116, a gate insulating layer and a gate electrode layer are formed and then patterned to produce a gate insulator 118 overlying silicon layer 116 and pillar 104, and a gate electrode 120 overlying gate insulator 118, as schematically shown in cross-section in FIG. 7. FIG. 8 shows a schematic cross-section of the structure of FIG. 7 after the formation of sidewall spacers 122 adjacent to gate electrode 120 and gate insulator 118. Sidewall spacers 122 are typically formed of silicon nitride. In the illustrated embodiment of the present invention, sidewall spacers 122 overlap barrier layer 112 as shown in FIG. 8. Additionally, sidewall spacers 122 serve to shadow pillar 104 from a subsequent deep S/D implant.

Figure 9:
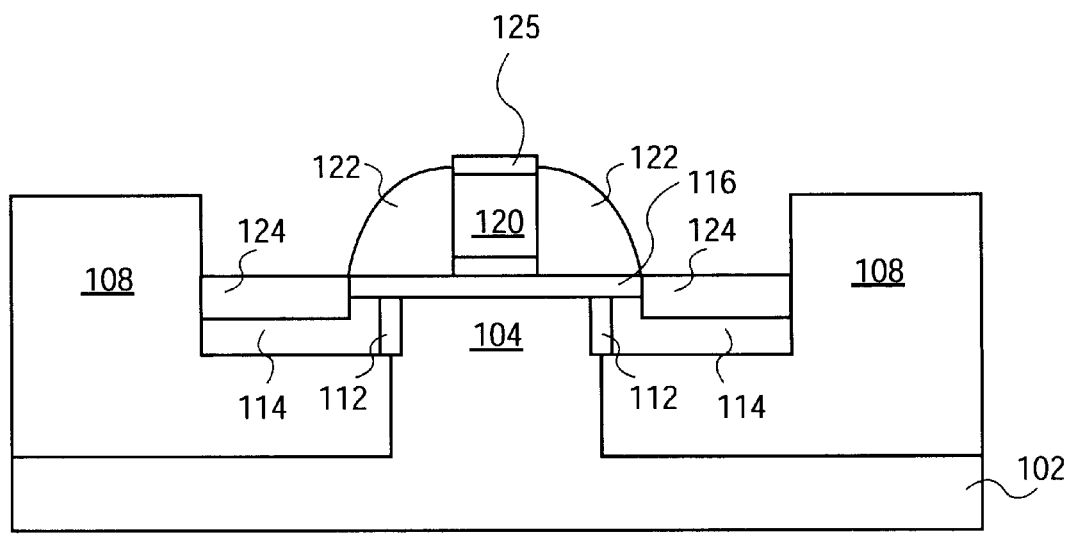
FIG. 9 is a schematic cross-section showing the structure of FIG. 8, after silicide formation.

As can be seen in FIG. 9, a silicidation operation forms silicided source/drain regions 124, and a silicided region 125 of gate electrode 120. Various metals can be used to form silicided regions 124, 125, including but not limited to titanium.

Figure 10:
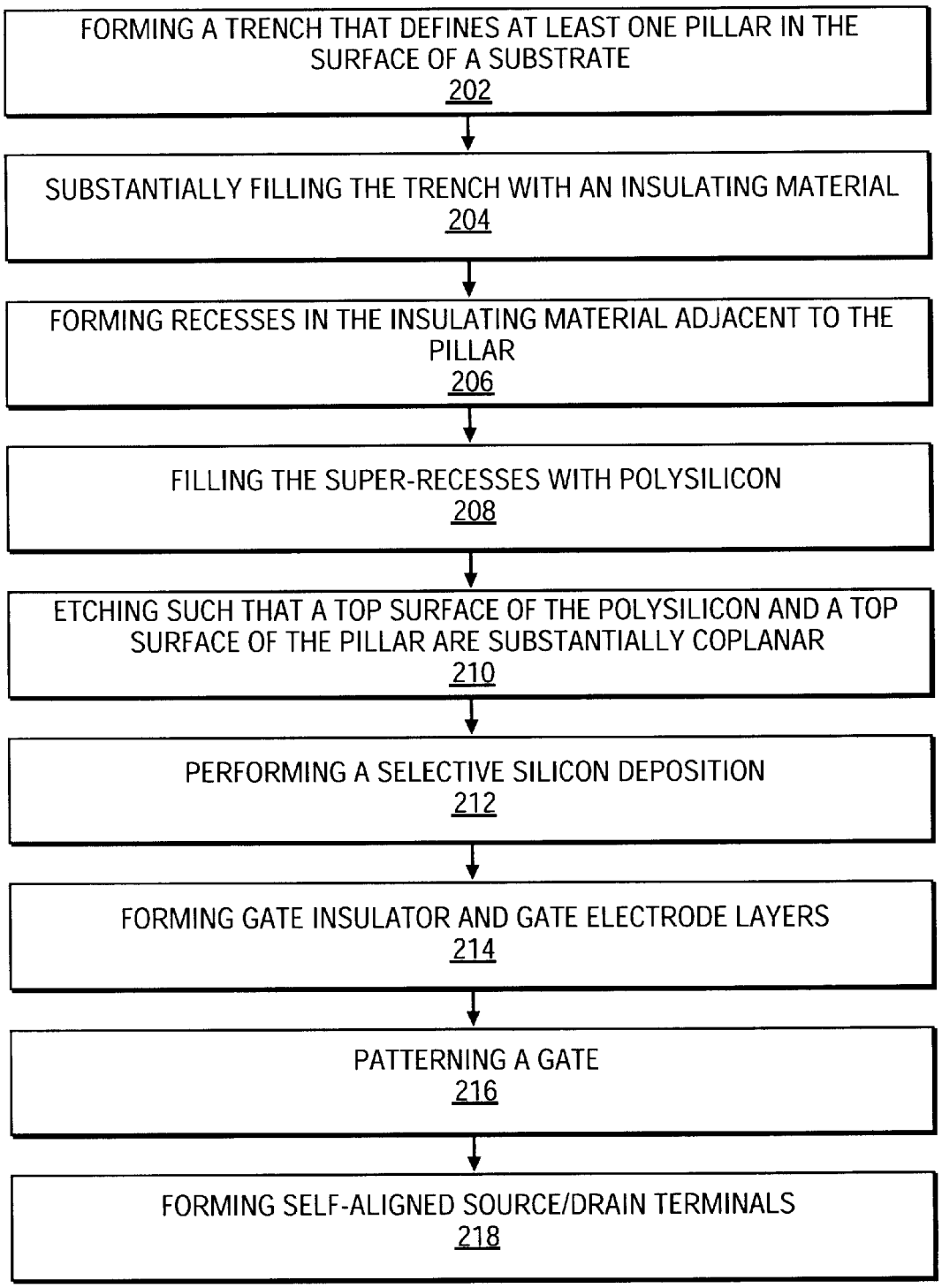
FIG. 10 is a flow diagram illustrating the various operations in a manufacturing process in accordance with the present invention.

The process operations of an illustrative embodiment of the present invention are further described with reference to FIG. 10. As shown at block 202 in FIG. 10, a trench is formed in the surface of a substrate. This typically includes forming a layer of silicon nitride on a silicon wafer, and patterning the silicon nitride such that portions of the underlying wafer are exposed for etching. Trenches in the surface of the wafer are formed by etching the exposed silicon.

Subsequently, as shown at block 204, the trenches are substantially filled with an insulating material. In the illustrated embodiment, trench filling takes place with the patterned silicon nitride layer still present on the surface of the substrate, and therefore the trench depth is determined at this point in the process by etch depth into the substrate plus the thickness of the silicon nitride layer. This is seen clearly in the cross-sections of FIGS. 1–2. Typically the trenches are substantially filled with silicon dioxide, although alternative schemes such as using other insulators, or combinations of insulators are within the scope of the invention. As shown at block 206, subsequent to substantially filling the trenches with insulating material, recesses in that insulating material are formed. In accordance with an embodiment of the invention suitable for fabricating FETs, a recess mask is used to define the areas where the recesses are to be formed. For FETs, the pillars formed at 202 are typically, but not necessarily, rectangular, and the recesses are formed on opposing sides to provide regions in which the FET source/drain terminals will be formed. Typically, the patterned silicon nitride layer that overlies the top surface of the pillar is removed at this point in the process.

After the patterned silicon nitride layer is removed, the recesses on opposing sides of the pillar are effectively joined into one larger opening, or "super-recess", that is bounded on its outer vertical sidewalls by the trench insulator material, and bounded on the bottom by the top surface of the pillar and the top surfaces of the trench insulator recesses. Introduction of impurities into the pillars is performed to establish the desired electrical characteristics of the pillars. Impurities may be introduced by diffusion, implantation, or any other suitable method. For example, n-type impurities, including but not limited to arsenic, are implanted into regions where p-type FETs are to be formed. Similarly, p-type impurities, including but not limited to boron, are implanted into regions where n-type FETs are to be formed. Typically a shield layer, alternatively referred to as a barrier layer, is formed on the exposed sidewall portions of the pillar. The structures produced are seen clearly in FIGS. 3–4. As indicated at block 208 in FIG. 10, the super-recesses are substantially filled with polysilicon. Alternatively, a-Si may used. Subsequently, the polysilicon in the super-recesses is etched back 210 until the top surface of the polysilicon and the top surface of the pillar are substantially coplanar. As indicated at 212 a selective silicon deposition is then performed. Lateral growth of this layer provides the mechanism by which silicon also covers the barrier layers.

In an alternative embodiment SiGe may be used in place of silicon to form the thin layer that spans across the S/D and channel regions.

Gate insulator and gate electrode layers are formed 214 over the surface of the substrate. The gate insulator is typically a thin layer of oxidized silicon, however the thickness and chemical make-up of the gate insulator layer may be varied within the scope of the invention. The gate electrode layer is typically formed of polysilicon. Gates, i.e., the gate electrode and the gate insulator taken together, are then patterned 216 by known methods. Typically sidewall spacers are formed adjacent to the gates. Such sidewall spacers may be formed of silicon nitride. Source/drain terminals are formed 218 typically by implanting impurities into the exposed silicon and the underlying polysilicon in the recessed portions of the trench insulator material.

Structure of a Shielded Channel Transistor

Referring to FIG. 9, a schematic cross-section of a shielded channel transistor (SCT) in accordance with embodiments of the present invention is shown.

An SCT in accordance with embodiments of the present invention is an insulated gate FET built on a silicon pillar 104 large enough to accommodate the channel and shallow S/D extensions. This pedestal is alternatively referred to as a pillar. The deep S/D region 114 used to make external contact to the device is formed using polysilicon embedded in trench isolation material 108, typically an oxide of silicon. S/D regions 114 are isolated from the transistor channel and silicon pillar 104 by a barrier layer 112. In typical embodiments of the present invention, barrier layer 112 is formed by oxidation of at least a portion of the sidewalls of pillar 104. Such barrier layers 112 may alternatively be referred to as a shield oxide. Connection between deep S/D regions 114 and the shallow S/D extensions is effectuated through a selective epi silicon layer 116 formed over pillar 104, shield oxides 112, and the polysilicon of deep S/D regions 114. Conventional spacer, S/D implant, and suicide operations are used to complete the transistor. Subsequent contact formation and wiring operations are used to interconnect transistors to form more complex circuits.

Embedding deep S/D regions 114 in the isolation material, rather than the bulk semiconductor, provides the low S/D capacitance feature of the present invention. Barrier layers 112 on the sidewalls of pillar 104 allow for termination of fields in the channel direction, thereby reducing the effects of DIBL.

Unlanded Contacts

Figure 11:
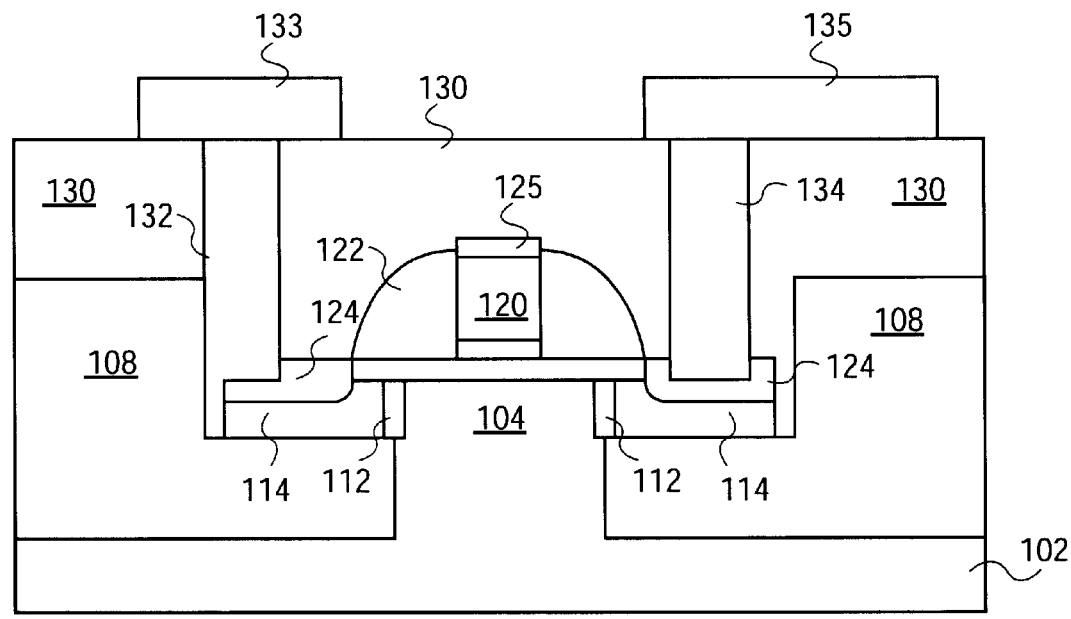
FIG. 11 is a schematic cross-section of an unlanded contact at a recessed S/D edge in accordance with an aspect of the present invention.

Referring to FIG. 11, a schematic cross-section showing an SCT with both a landed contact and an unlanded contact.

In the illustrative embodiment shown, an inter-layer dielectric 130 overlies trench oxide 108, silicided S/D and gate regions 124, 125, sidewall spacers 122. Contact openings are formed through inter-layer dielectric 130 and filled with a conductive material. As can be seen in FIG. 10, contact 132 is unlanded, that is, only partially overlapped by silicided region 124. In contrast, contact 134 is landed, that is, completely overlapped by silicided region 124.

As will be appreciated by those skilled in the art having the benefit of the present disclosure, the successful formation of contact 132, as compared to conventional S/D contacts, is less sensitive to manufacturing variations, such as misalignment, misregistration, overetching, and so on, because failure to maintain S/D overlap around the contact does not result in creating an unintended connection to the bulk semiconductor.

Local Interconnect

The local interconnect feature of the present invention results from the fact that the embedded S/D regions can cross well boundaries in the field oxide and connect diffusions without shorting the wells they are placed in. Further, because the S/D regions are silicided, the sheet resistivity of this form of interconnect is relatively low, typically being in the range of approximately 2–10 ohms per square.

Figure 12:
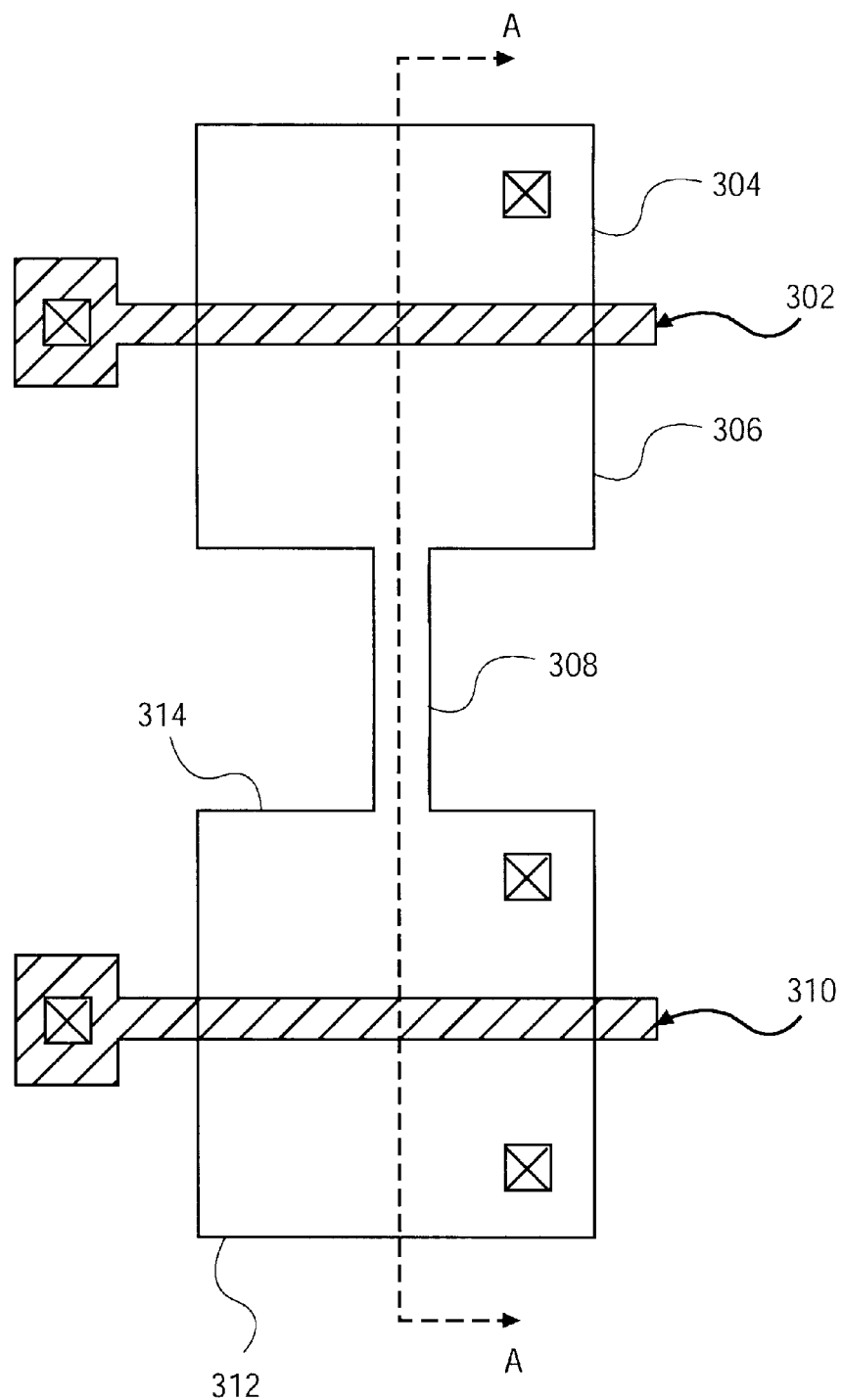
FIG. 12 is a top view of a transistor layout with the contactless N to P diffusion connection.

An illustrative embodiment of the present invention is shown in FIG. 12 as a schematic top view of a transistor layout incorporating the local interconnect feature of the present invention. The local interconnect feature provides a contactless N to P connection. A p-channel FET (PFET) having a gate 302 is shown along with its associated source and drain terminals 304, 306. Similarly an n-channel FET (NFET) having a gate 310 is shown along with its associated source and drain terminals 312, 314. The two FETs are coupled to form an inverter. More particularly, drain 306 and drain 314 are coupled by a local interconnect 308 that is formed from silicided polysilicon that resides in a recess in field oxide.

Figure 13:
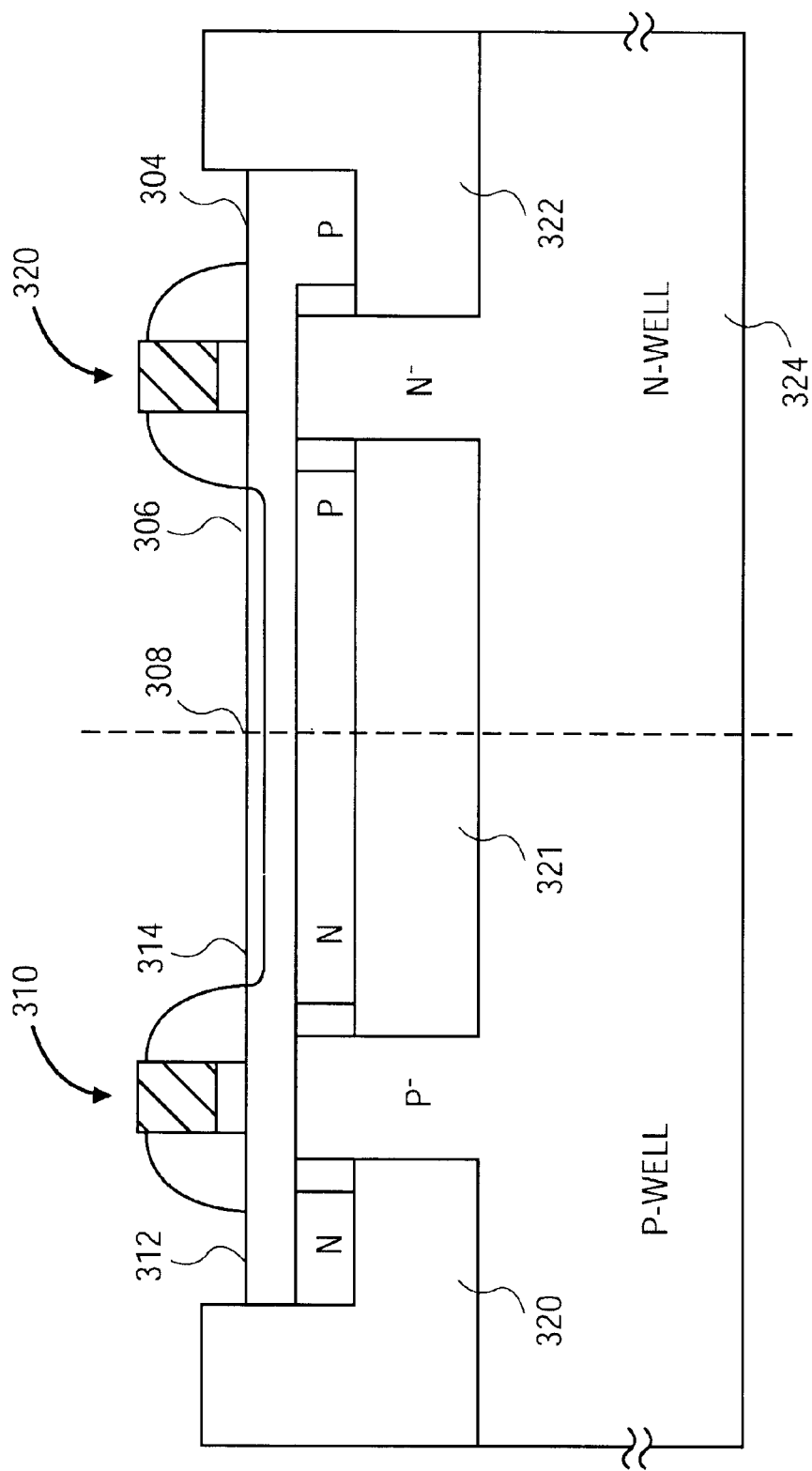
FIG. 13 is a cross-sectional side view of the transistor layout with the contactless N to P diffusion connection in accordance with the present invention

FIG. 13 shows a schematic cross-section of FIG. 12 taken along line A—A. FIG. 13 illustrates the circuit formed in substrate 324, and in particular the connection made between the two FETs by local interconnect 308. Local interconnect 308 includes the doped polysilicon formed in a recess in field oxide 321, and a silicided upper portion which effectively shorts together the N doped and P doped portions of the polysilicon. In this way a connection between the two transistors can be made without having to form a contact to an interconnect line, such as metal, on another level.

Conclusion

Embodiments of the present invention provide the low S/D capacitance typically associated with SOI, without the need for SIMOX or bonded substrates. Embodiments of the present invention also eliminate the floating body and back gate effects found in SOI because the SCT channel is in a bulk well. The isolation of the channel from the deep S/D allows shorter effective channel lengths without requiring increases in well or halo implant doses. The local interconnect functionality and unlanded diffusion contact capability are features provided by the structure and implementation method.

It will be understood by those skilled in the art having the benefit of this disclosure that many design choices are possible within the scope of the present invention. For example, structural parameters, including but not limited to, gate insulator thickness, gate insulator materials, gate electrode thickness, sidewall spacer material, inter-layer dielectric material, isolation trench depth, and S/D and well doping concentrations may all be varied from that shown or described in connection with the illustrative embodiments.

It will be understood that various other changes in the details, materials, and arrangements of the parts and steps which have been described and illustrated may be made by those skilled in the art having the benefit of this disclosure without departing from the principles and scope of the invention as expressed in the subjoined Claims.

What is claimed is:

1. An insulated gate field effect transistor comprising:

a substrate having at least one pillar defined by a trench, the pillar having a top surface;

an insulating material disposed within the trench, the insulating material having a recessed portion such that the insulating material is recessed away from an upper portion of the pillar;

a doped polysilicon layer disposed within the recessed portion of the insulating material;

a layer of single crystal silicon superjacent the doped polysilicon layer and the pillar;

a gate insulator layer superjacent the single crystal layer of silicon; and a gate electrode superjacent the gate insulator layer.

2. The transistor of claim 1, wherein the doped polysilicon layer has a top surface that is substantially coplanar with the top surface of the pillar.

3. The transistor of claim 1, wherein the insulating material comprises silicon dioxide.

4. The transistor of claim 1, wherein the gate insulator comprises silicon dioxide.

5. The transistor of claim 1, further comprising a barrier layer disposed between the pillar and the doped polysilicon.

6. The transistor of claim 5, wherein the barrier layer comprises silicon dioxide.

7. The transistor of claim 1, wherein the pillar is contiguous with the substrate.

8. The transistor of claim 1 wherein the pillar and substrate are continuous with each other and both comprise single crystal silicon.

9. An insulated gate field effect transistor comprising:

a substrate having at least one pillar defined by a trench, the pillar having a top surface and being continuous with the substrate;

an insulating material disposed within the trench, the insulating material having a recess therein adjacent to the pillar such that the insulating material is recessed away from an upper portion of the pillar;

a doped amorphous silicon layer disposed within the recessed portion of the insulating material;

a layer of single crystal silicon superjacent the doped amorphous silicon layer and the pillar; and insulator layer superjacent the single crystal layer of silicon; and a gate electrode superjacent the gate insulator layer.

* * * * *